United States Patent
Sarda

(10) Patent No.: US 10,270,457 B2
(45) Date of Patent: Apr. 23, 2019

(54) HIGH FREQUENCY SYNTHESIS AND DUTY CYCLE CONTROL WITH INTERPOLATIVE DIVIDERS USING A LOW SPEED INTERFACE

(71) Applicant: Silicon Laboratories Inc., Austin, TX (US)

(72) Inventor: Vivek Sarda, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 15/385,311

(22) Filed: Dec. 20, 2016

(65) Prior Publication Data
US 2018/0175871 A1 Jun. 21, 2018

(51) Int. Cl.
*H03B 21/00* (2006.01)
*H03L 7/197* (2006.01)

(52) U.S. Cl.
CPC .................. *H03L 7/1974* (2013.01)

(58) Field of Classification Search
CPC ..................................... H03L 7/1974
See application file for complete search history.

(56) References Cited

U.S. PATENT DOCUMENTS

| | | | |
|---|---|---|---|
| 7,417,510 B2 | 8/2008 | Huang | |
| 7,764,134 B2 | 7/2010 | Fu et al. | |
| 7,800,451 B2 | 9/2010 | Fu et al. | |
| 7,839,225 B2 | 11/2010 | Huang | |
| 7,969,251 B2 | 6/2011 | Fu et al. | |
| 8,193,867 B2 | 6/2012 | Fu et al. | |
| 8,248,175 B2 | 8/2012 | Hara | |
| 8,441,291 B2 | 5/2013 | Hara et al. | |
| 8,514,118 B2 | 8/2013 | Eldredge | |
| 8,531,246 B2 | 9/2013 | Huang | |
| 8,692,599 B2 | 4/2014 | Gong et al. | |
| 8,736,476 B2 | 5/2014 | Gong et al. | |
| 8,786,341 B1 | 7/2014 | Weltin-Wu et al. | |
| 8,791,734 B1 | 7/2014 | Hara et al. | |
| 8,885,106 B2 | 11/2014 | Koroglu et al. | |
| 8,994,420 B2 | 3/2015 | Eldredge et al. | |
| 9,106,867 B2 | 8/2015 | Koroglu et al. | |
| 9,356,606 B2 | 5/2016 | Caffee et al. | |
| 9,362,936 B1 | 6/2016 | Caffee et al. | |
| 9,531,394 B1 | 12/2016 | Caffee et al. | |
| 2012/0092051 A1* | 4/2012 | Erdogan ............... H03L 7/0812 327/158 |

* cited by examiner

*Primary Examiner* — Daniel Puentes
(74) *Attorney, Agent, or Firm* — Zagorin Cave LLP

(57) ABSTRACT

An interpolative divider includes a look ahead sigma delta modulator circuit to generate divide values according to a divide ratio. A plurality of M storage elements are coupled to the sigma delta modulator to store the divide values, M being at least 2. A selector circuit selects the respective divide values and supplies the divide values to a portion of an interpolative divider circuit, the portion including a divider and a phase interpolator. The interpolative divider generates an output clock signal having a first clock period that may be determined by the first and second divide values. The M storage elements are loaded by a clock signal that is slower than the output clock signal by at least half.

22 Claims, 5 Drawing Sheets

HIGH FREQUENCY SYNTHESIS AND DUTY CYCLE CONTROL WITH INTERPOLATIVE DIVIDERS USING A LOW SPEED INTERFACE

BACKGROUND

Field of the Invention

This invention relates to frequency synthesis using interpolative dividers.

Description of the Related Art

Frequency synthesis using interpolative dividers provides a way to generate clock signals. One such interpolative divider is discussed in U.S. Pat. No. 7,417,510, issued Aug. 26, 2008 entitled "Direct Digital Interpolative Synthesis", naming Yunteng Huang as an inventor, which application is incorporated herein by reference.

A prior art system with an interpolative divider 100 is shown in FIG. 1. A sigma delta modulator 101 receives a divide value 102 and supplies a fractional-N divider and phase interpolator portion 105 of the interpolative divider with an N bit divide value including a fractional portion and an integer portion. The interpolative divider supplies a clock out signal 107 and supplies a clock signal 109 to clock in the N bit output of the sigma delta modulator 101 into storage element 103. The interface between the fractional-N divider and phase interpolator portion 105 of the interpolative divider and the sigma delta modulator 101 is a high speed interface operating at the frequency of the clock out signal 107.

Referring to FIG. 2, another view of an interpolative divider 200 is illustrated. The divider includes a fractional-N divider 201, which receives the input clock signal 203. The input clock signal may come from a phase-locked loop, a MEMs device, or some other frequency source. A first order sigma delta modulator 205 receives the digital divide ratio (M/N) 202, which may be non-integer. The fractional-N divider 201 receives a divide control signal 206 in a stream of integers to approximate the actual divide ratio. Thus, the integer portion of the divide ratio is supplied to the fractional-N divider 201. The digital quantization error, corresponding to the fractional portion of the divide ratio, is supplied to the digitally controlled phase interpolator 207. Phase interpolator 207 cancels the jitter introduced by the fractional-N divider 201 using interpolation based on the digital quantization error supplied by the sigma delta modulator 205. Thus, the input clock signal is divided down by the fractional-N divider according to the control information provided by the sigma delta modulator 205. The phase interpolator 207 cancels the quantization errors in the output of the fractional-N divider 201.

SUMMARY OF EMBODIMENTS OF THE INVENTION

In an embodiment, an apparatus includes a look ahead sigma delta modulator circuit to generate divide values according to a divide ratio. A plurality of M storage elements are coupled to the sigma delta modulator to store respective divide values generated, at least in part, by the look ahead sigma delta modulator circuit, M being an integer of at least 2. A selector circuit selects the respective divide values. A portion of an interpolative divider circuit is coupled to the selector circuit, the portion including a divider and a phase interpolator. The portion generates an output clock signal having a first clock period. A duration of a first portion of the first clock period is determined by a first divide value of the respective divide values selected by the selector circuit and a duration of a second portion of the first clock period is determined by a second divide value of the respective divide values selected by the selector circuit.

In another embodiment, a method includes generating divide values according to a divide ratio in a sigma delta modulator. M storage elements store respective divide values generated, at least in part, by the sigma delta modulator, M being an integer of at least 2. A first divide value and a second divide value of the respective divide values are selected by a selector circuit and provided to a portion of an interpolative divider circuit including a fractional-N divider and a phase interpolator. An output clock signal is generated having a clock period with a high portion and a low portion from the interpolative divider circuit, a length of the high portion being determined, at least in part, by the first divide value, and a length of the low portion being determined, at least in part, by the second divide value.

In another embodiment, an interpolative divider includes a plurality of M storage elements to store respective divide values generated, at least in part, by a lookahead sigma delta modulator circuit, M being an integer of at least two. A selector circuit is coupled to the storage elements and selects respective ones of the divide values. A portion of an interpolative divider circuit is coupled to receive the respective ones of the divide values and generate an output clock signal, the portion including a divider and a phase interpolator. The M storage elements are loaded by a storage element clock signal derived from the output clock signal, a first frequency of the output clock signal being at least twice a second frequency of the storage element clock signal.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 2:
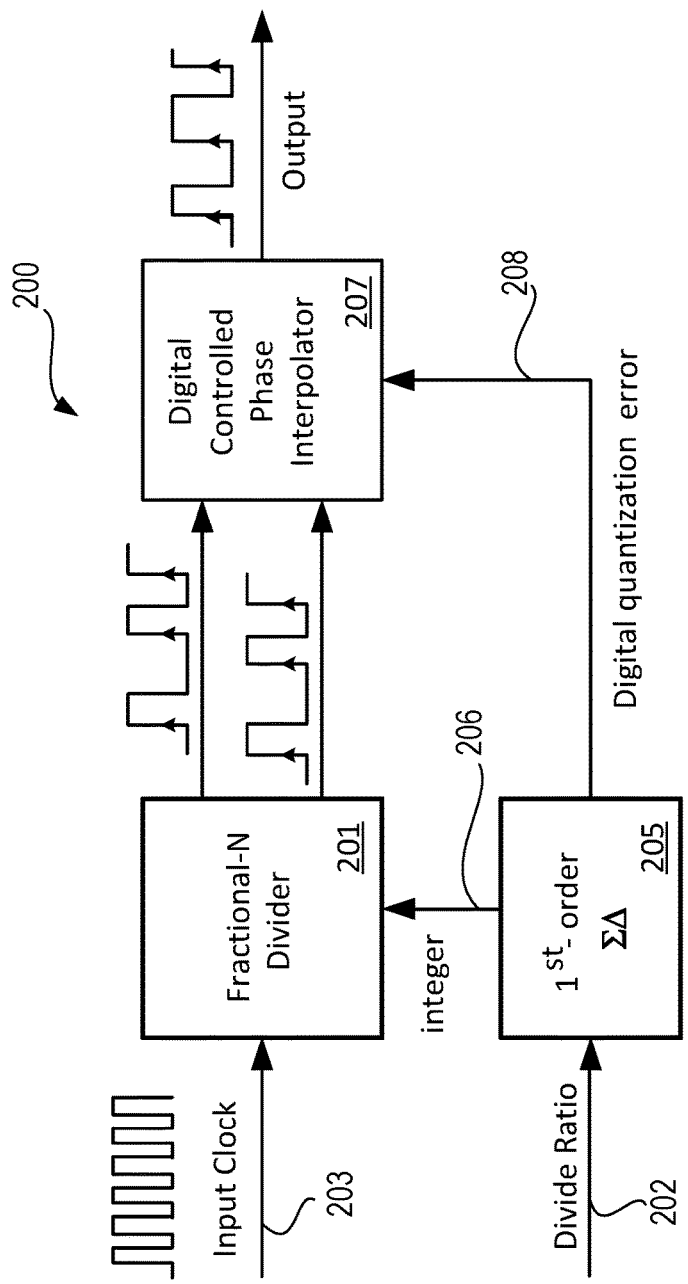
FIG. 2 illustrates another view of an interpolative divider.
Figure 3:
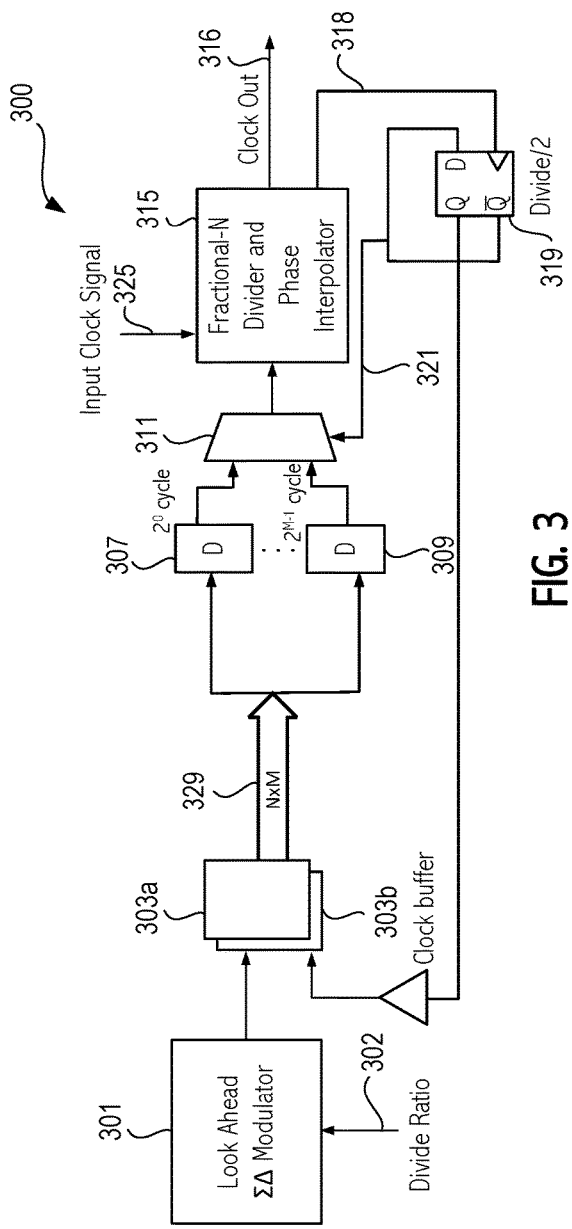
FIG. 3 illustrates an interpolative divider system according to an embodiment of the invention.

FIG. 3 illustrates an embodiment of an interpolative divider 300. The interpolative divider 300 includes a look ahead sigma delta modulator 301 that receives a divide ratio 302 and supplies divide values including an integer portion and a fractional portion to storage elements 303a and 303b, which in turn supply the divide values to storage elements 307 and 309. Storage elements 303a, 303b, 307 and 309 may be implemented as any appropriate storage circuits, e.g., flip-flops, latches, registers, or other appropriate storage elements suitable for the technology. Multiplexer 311 selects one of the divide values stored in storage elements 307 and 309 and supplies the selected divide value to the fractional-N divider and phase interpolator portion 315. The fractional-N divider and phase interpolator portion 315 may be implemented in a manner similar to the fractional-N divider 201 and the phase interpolator 207 shown in FIG. 2. The fractional-N divider and phase interpolator portion 315 supplies the output clock signal 316 and the input clock signal 318 to the divide by 2 circuit 319. In an embodiment, clock signal 318 is the fractional-N clock signal prior to phase interpolation, e.g., from fractional-N divider 201 in FIG. 2 and clock signal 316 is after phase interpolation. The divide-by-2 circuit 319 supplies the multiplexer select signal 321 such that the multiplexer 311 selects a different one of the divide values stored in storage elements 307 and 309 for every clock period of output clock 316. Thus, the selection logic cycles through the storage elements 307 and 309 in M output clock cycles, where M is the number of storage elements. During the first cycle (($2^0$) cycle) the multiplexer picks the divide value in storage element 307 and in the next cycle ($2^{M-1}$ cycle) selects the divide value in storage element 309. Where M=2, there are only two cycles. The fractional-N divider and phase interpolator portion 315 also receives an input clock signal 325, which is the clock signal that is divided by the interpolative divider 300.

The divide by two circuit 319 also supplies the load signal to storage elements 303a and 303b that receive the divide values from the sigma delta modulator 301. The interface 329 between storage elements 303a and 303b and storage elements 307 and 309 is N×M (where M is the number of storage elements and N is the number of bits in each divide value). In the example shown in FIG. 3, there are two storage elements 307 and 309 to store two divide values so the value of M is two and the width of the interface is N×2. In other embodiments, the value of M may be 4, 8, or some other number suitable for the system. In such a case interface 329 would be wider to accommodate the additional divide values. The embodiment of FIG. 3 may be suitable for an output clock signal 316 without duty cycle control. As described further herein, other capabilities, such as duty cycle control or pulse skipping may require interface 329 to be wider than shown in FIG. 3.

Figure 1:
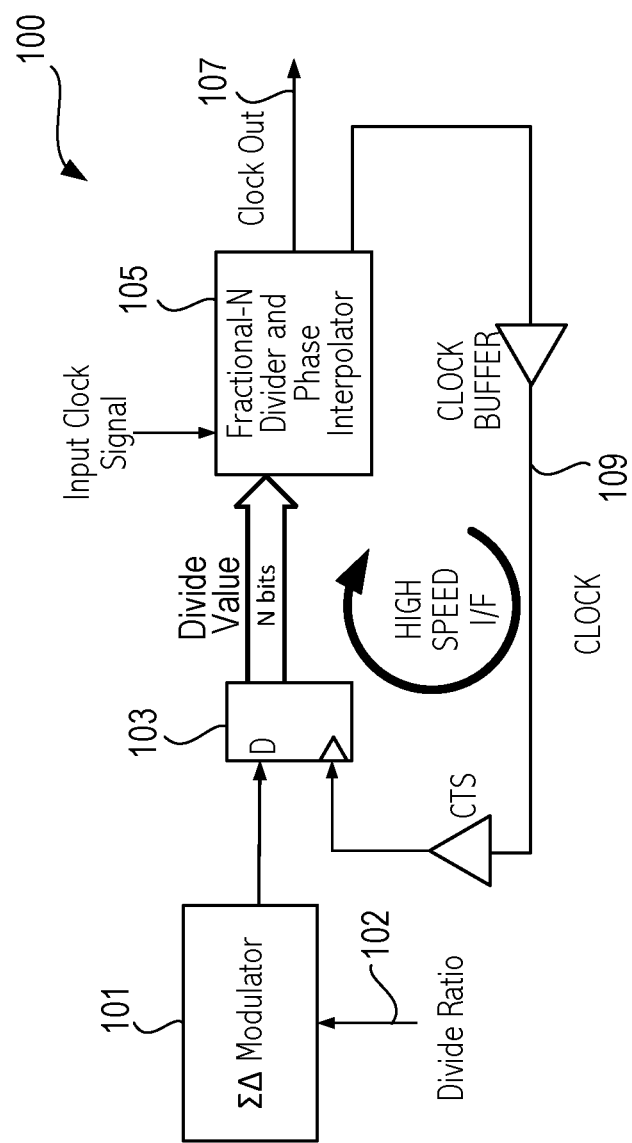
FIG. 1 illustrates a prior art interpolative divider system.

Frequency synthesis is limited by the speed of the analog to digital interface 329 between the sigma delta modulator and fractional-N divider and phase interpolator portion 315. Note that the sigma delta modulator 301 is digital logic and the fractional-N divider and phase interpolator portion 315 has a substantial analog component. The interface speed impacts time to market due to the due diligence required to design the high speed interface. In the embodiment shown in FIG. 3 the interface of FIG. 1 is replaced with a multi block interface shown in FIG. 3 that transfers N×M data at a lower speed than the interface of FIG. 1. Thus, where M is 2, the interface 329 transfers twice the data at half the speed. The width of the interface can be readily scaled up to, e.g., four or eight and the speed further reduced by four or eight. The slower speed makes design easier by relaxing layout constraints, timing constraints, and can improve test coverage by at speed scan.

Changing the interface to a lower speed helps in allowing the frequency synthesis to operate at higher frequencies and provide duty cycle control. If there are limits to how fast the analog/digital interface can operate, that limits the output frequency of the interpolative divider. By using a slower interface speed, that limitation is alleviated and the output frequency can increase.

Figure 4:
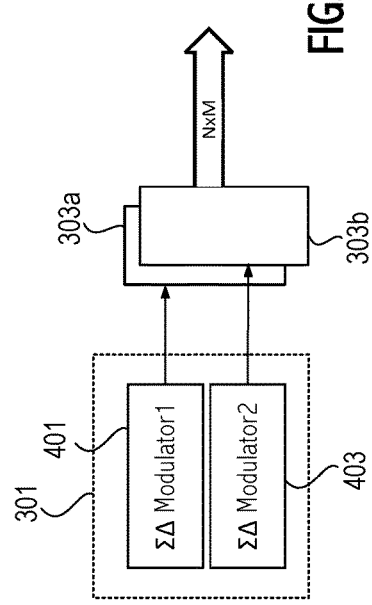
FIG. 4 illustrates an example of a look ahead interpolative divider.

Sigma delta modulator 301 is a "look ahead" sigma delta modulator and provides enough divide values for consumption in the future that they can be sent over interface 329 and consumed by the fractional-N divider and phase interpolator portion 315. FIG. 4 shows one approach to providing a look ahead sigma delta modulator 301. The approach of FIG. 4 uses two sigma delta modulators 401 and 403 to provide separate divider values. Each sigma delta can provide one set of values that can either be correlated or uncorrelated with the other sigma delta divider. In other embodiments, a sigma delta modulator that provides multiple groups of bits at the same time can be used. The particular implementation for the look ahead sigma delta modulator depends on criteria such as available area, power, and required speed.

Figure 5A:
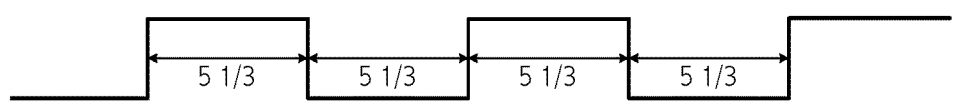
FIGS. 5A, 5B, 5C, and 5D illustrate waveforms showing various capabilities that may be associated with embodiments of an interpolative divider system shown in FIG. 3 or FIG. 6.
Figure 5B:
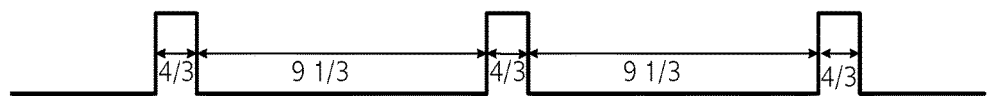

In addition to alleviating design constraints, multiple storage element 307 and 309 in the slower interface allows increased capability. Referring to FIGS. 5A-5D, the additional capability is shown in graphical form. FIG. 5A illustrates a divide value of 5⅔ that provides a 50% duty cycle. FIG. 5B shows an example where using two different divide ratio numbers in storage elements 307 and 309 can be used to provide duty cycle control. For example, the first divide ratio may be 2⅓ in storage element 307 and the second divide ratio provided may be 8⅓ from storage element 309. The output of the interpolative divider in FIG. 5B shows a clock signal with the same frequency as FIG. 5A but a different duty cycle. Note that while the two storage elements 307 and 309 in FIG. 3 may be used to control the duty cycle, they may be used in other ways. For example, the storage elements may be loaded with the same value to achieve the waveform shown in FIG. 5A. In other embodiments, each storage element may be used for a period of the output clock signal. For example, storage element 307 may provide the first period and storage element 309 may provide the second period. Each period may be a 50% duty cycle so the value in a single storage element may be used for both halves of the period. Even though there is no duty cycle control, there is still the advantage of a slower interface between the analog and digital portions of the logic, which can allow for much faster speeds on the output clock with the same level of control for a given process.

Figure 5C:
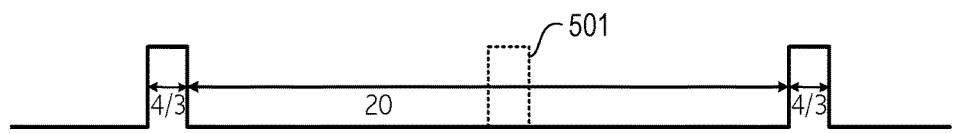

FIG. 5C shows a pulse skipping example facilitated by the architecture with multiple storage elements 307 and 309. Assume that the interpolative divider has been supplying an output clock signal with the waveform shown in FIG. 5B. Thus, the divide values are nominally 2⅓ and 8⅓. Note that these values are nominal values as the actual values will vary due to the use of the sigma delta modulator to generate the divide values. Also, assume that control logic has determined that a pulse should be skipped. Storage element 307 supplies 2⅓ as the divide value while storage element 309 supplies a divide value of 20. That achieves the output waveform shown in FIG. 5C where the pulse 501 is skipped. The storage elements may then be reloaded for the next clock cycle with 2⅓ and 8⅓ to resume the same waveform as shown in FIG. 5B.

Figure 5D:
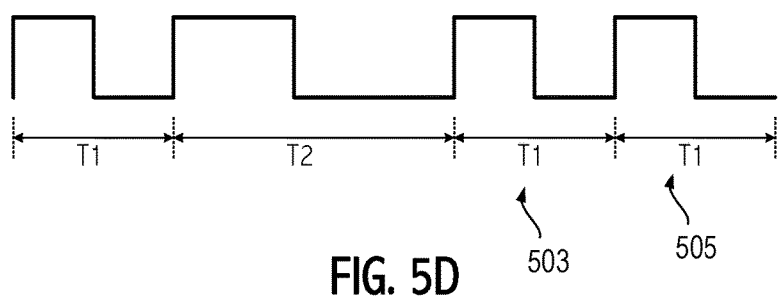

FIG. 5D shows a chirp example that provides an output clock signal with different frequencies. The first time that storage elements 307 and 309 are loaded results in an output waveform with a frequency f1 corresponding to period T1. The second time the storage elements are loaded results in the output waveform having a frequency f2 corresponding to the period T2, which is a lower frequency than the frequency f1. The third and fourth times the storage elements 307 and 309 are loaded, results in the output waveform resuming and maintaining the frequency f1. The example shown in FIG. 5D is just a simple example. Rather than one period with a different frequency, the waveform may sweep from a high to low frequency or vice versa. In addition, multiple different frequencies may be inserted in the waveform by adjusting the divide value as desired. For example, one or more of the portions of the waveform corresponding to the periods 503 and 505 may be a frequency other than f1 and f2. In addition, the frequency f2 may be maintained for more than one cycle. The particular frequencies are determined for any particular portion of the clock cycle by the divide values stored in storage elements 307 and 309.

In addition, the storage elements may be utilized to provide a phase change to align the output clock signal with a signal downstream. For example, with respect to FIG. 5A, a phase of the output clock signal may be adjusted by making for one cycle one of the half periods 6⅓ instead of 5⅓. That can be used to cause a phase change in the output clock signal.

Referring back to FIG. 3, the N×M size of the interface 329 is suitable for embodiments in which each storage element 307 and 309 stores a divider value for a 50% duty cycle clock. For embodiments where duty cycle control is desired, the width of the interface 329 may double to 2×N×M and each half cycle of clock signal 321 loads both halves of the duty cycle into block 315 through the use of wider storage elements 307 and 309 or a multiplexer circuit that selects multiple storage elements for simultaneously loading into block 315. Block 315, which is an analog block, then selects the appropriate one of the duty cycle controls for each half cycle of the output clock signal 316. That allows the digital logic 307, 309 and 311 to still operate at a lower speed, simplifying design. If both duty cycle control and pulse skipping is desired, the width of the interface 329 may be 4×N×M or 8×N×M.

Figure 6:
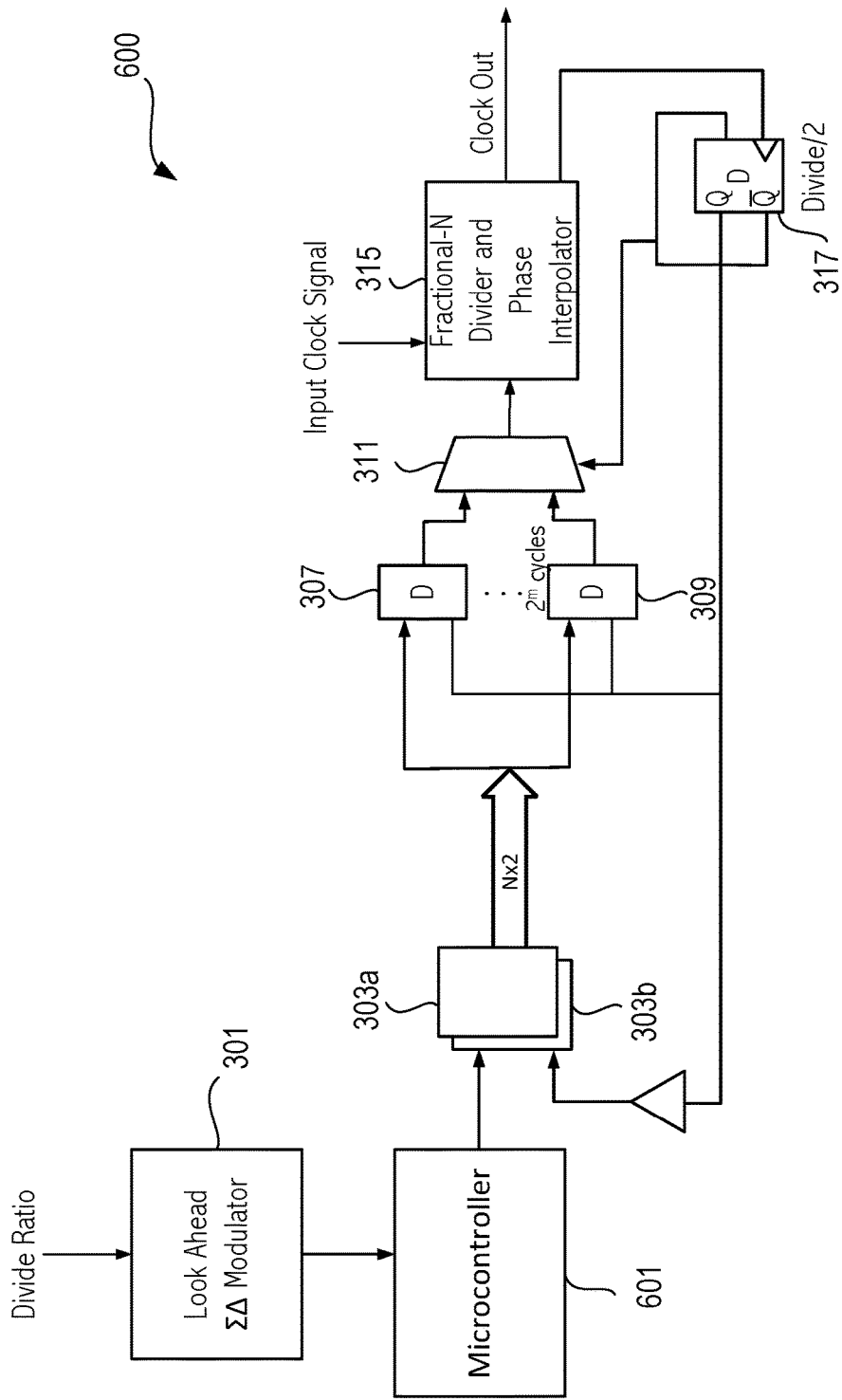
FIG. 6 illustrates an embodiment that utilizes a microcontroller to control aspects of the divide values to achieve various capabilities illustrated in FIG. 5.

Referring to FIG. 6, a microcontroller 601 or other control logic may be inserted between the look ahead sigma delta modulator 301 and storage elements 303*a* and 303*b* to provide control to achieve some or all of the phase adjust, chirp, and/or duty cycle capabilities described in FIGS. 5A-5D. For example, a request may be received to adjust a phase of the output signal to match a downstream signal. The microcontroller 601 may determine the needed adjustment to one of the divide values supplied to the interpolative dividers to achieve the desired phase adjustment. Note that the divide value may be adjusted up or down. Further, the microcontroller may receive a request that causes the microcontroller to skip a pulse. The chirp may also be controlled by the microcontroller, e.g., by periodically (e.g., every 20) divide values, inserting a different frequency into the stream of divide values. The microcontroller can count the number of divide values being supplied and insert desired divide value(s) when the proper count value is reached. The divide value for the desired frequency may be stored in memory accessible to the microcontroller.

Thus, various aspects have been described relating to an interpolative divider. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. An apparatus comprising:
    a sigma delta modulator circuit to generate respective divide values according to a divide ratio;
    a plurality of M storage elements coupled to the sigma delta modulator circuit to store the respective divide values generated, at least in part, by the sigma delta modulator circuit, M being an integer of at least 2;
    a selector circuit to select from the respective divide values; and
    a portion of an interpolative divider circuit coupled to the selector circuit, the portion including a divider and a phase interpolator, the portion of the interpolative divider circuit coupled to generate an output clock signal having a first clock period, a duration of a first portion of the first clock period being determined by a first divide value of the respective divide values selected by the selector circuit and a duration of a second portion of the first clock period being determined by a second divide value of the respective divide values selected by the selector circuit.

2. The apparatus as recited in claim 1, where the M storage elements are clocked by a storage element clock signal having a first frequency and the output clock signal has a second frequency, the second frequency being at least twice as fast as the first frequency.

3. The apparatus as recited in claim 2 wherein the sigma delta modulator circuit is a look ahead sigma delta modulator circuit configured to supply multiple divide values so as to load the M storage elements with the respective divide values at the first frequency.

4. The apparatus as recited in claim 1, wherein the M storage elements are clocked by a storage element clock signal derived from the output clock signal that runs at a frequency of the output clock signal divided by M.

5. The apparatus as recited in claim 1, further comprising:
    a processor coupled between the sigma delta modulator circuit and the plurality of M storage elements to adjust one or more aspects of the divide values.

6. The apparatus as recited in claim 5,
    wherein one of the aspects is a phase offset from an input clock signal to the interpolative divider circuit.

7. The apparatus as recited in claim 1, wherein the interpolative divider circuit is further coupled to receive a third divide value and a fourth divide value to thereby cause the interpolative divider circuit to cause a pulse to be skipped in the output clock signal.

8. The apparatus as recited in claim 1,
    wherein the first clock period has a first length determined by the first divide value and the second divide value and the output clock signal has a second period of a second length determined by third and fourth divide values loaded into respective ones of the M storage elements.

9. The apparatus as recited in claim 8,
    wherein the output clock signal has a third period corresponding to a third frequency, the third period having a third length determined by additional divide values.

10. A method comprising:
    generating respective divide values according to a divide ratio in a sigma delta modulator;
    storing in M storage elements the respective divide values generated, at least in part, by the sigma delta modulator, M being an integer of at least 2;
    selecting in a selector circuit a first divide value and a second value of the respective divide values and providing the selected first and second divide values to a portion of an interpolative divider circuit including a fractional-N divider and a phase interpolator; and generating an output clock signal having a clock period with a high portion and a low portion from the interpolative divider circuit, a length of the high portion being determined, at least in part, by the first divide value, and a length of the low portion being determined, at least in part, by the second divide value.

11. The method as recited in claim 10, wherein a duty cycle of the output clock signal is other than fifty percent.

12. The method as recited in claim 10 further comprising: loading the storage elements using a storage element clock signal having a first frequency that is half or less than a second frequency of the output clock signal.

13. The method as recited in claim 12, further comprising:
dividing the output clock signal by M and generating a storage element clock signal;
loading the storage elements using the storage element clock signal.

14. The method as recited in claim 10, further comprising:
adjusting one or more aspects of the divide values supplied by the sigma delta modulator before supplying the divide values to the M storage elements.

15. The method as recited in claim 14, wherein one of the aspects is a phase offset from an input clock signal to the interpolative divider circuit.

16. The method as recited in claim 10, further comprising:
supplying a third divide value and a fourth divide value to the interpolative divider circuit to thereby cause the interpolative divider circuit to skip a pulse in the output clock signal.

17. The method as recited in claim 10, further comprising:
generating the output clock signal from the interpolative divider circuit using the first and the second divide values to define a first period of the output clock signal;
generating a second period of the output clock signal after the first period using a third divide value and a fourth divide value loaded into respective ones of the M storage elements;
where a length of the first period corresponds to a first frequency and a length of the second period corresponds to a second frequency.

18. The method as recited in claim 17 further comprising, generating a third period of a third length determined by a fifth divide value of the respective divide values and a sixth divide value of the respective divide values loaded into respective ones of the M storage elements wherein the third period corresponds to a third frequency.

19. An interpolative divider comprising:
a plurality of M storage elements to store divide values generated, at least in part, by a sigma delta modulator circuit, M being an integer of at least 2;
a selector circuit coupled to the M storage elements to select respective ones of the divide values;
a portion of the interpolative divider coupled to receive the respective ones of the divide values and generate an output clock signal, the portion including a divider and a phase interpolator; and
wherein the M storage elements are loaded by a storage element clock signal derived from the output clock signal, the storage element clock signal having a first frequency, the output clock signal having a second frequency being at least twice the first frequency of the storage element clock signal.

20. The interpolative divider as recited in 19 wherein the second frequency is the first frequency divided by M.

21. The interpolative divider as recited in claim 19 wherein the output clock signal has a first clock period and a duration of a first portion of the first clock period is determined by a first divide value of the respective ones of the divide values selected by the selector circuit and a duration of a second portion of the first clock period being determined by a second divide value of the respective ones of the divide values next selected by the selector circuit and the first and second portions are a different length.

22. The interpolative divider as recited in claim 19 wherein the sigma delta modulator circuit supplies M divide values as the respective divide values, the M divide values each being N bits long, the N by M bits of divide values being loaded into the M storage elements at the first frequency that is less than a frequency of consumption of the respective divide values by the divider and phase interpolator.

* * * * *